United States Patent
Yamanaka

(10) Patent No.: US 8,742,861 B2
(45) Date of Patent: Jun. 3, 2014

(54) SURFACE ACOUSTIC WAVE RESONATOR, SURFACE ACOUSTIC WAVE OSCILLATOR, AND SURFACE ACOUSTIC WAVE MODULE UNIT

(71) Applicant: Seiko Epson Corporation, Tokyo (JP)

(72) Inventor: Kunihito Yamanaka, Kamiina-gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/630,490

(22) Filed: Sep. 28, 2012

(65) Prior Publication Data

US 2013/0021110 A1    Jan. 24, 2013

Related U.S. Application Data

(63) Continuation of application No. 13/124,980, filed as application No. PCT/JP2009/005540 on Oct. 22, 2009, now Pat. No. 8,299,680.

(51) Int. Cl.
*H03H 9/25*    (2006.01)

(52) U.S. Cl.
USPC .............. 331/155; 310/313 A; 310/313 B; 331/158

(58) Field of Classification Search
USPC ............ 331/156, 158, 155; 310/344, 313 A, 310/313 B
See application file for complete search history.

(56) References Cited

U.S. PATENT DOCUMENTS

| 5,256,927 | A  | 10/1993 | Kato et al. |
| 6,420,946 | B1 | 7/2002  | Bauer et al. |
| 7,002,438 | B2 | 2/2006  | Kawachi et al. |
| 7,042,132 | B2 | 5/2006  | Bauer et al. |

FOREIGN PATENT DOCUMENTS

| JP | A-61-220515  | 9/1986  |
| JP | A-63-135010  | 6/1988  |
| JP | A-3-139008   | 6/1991  |
| JP | A-10-335966  | 12/1998 |
| JP | A-11-112274  | 4/1999  |
| JP | B2-3310132   | 7/2002  |
| JP | A-2003-258595 | 9/2003  |
| JP | A-2003-322953 | 11/2003 |
| JP | A-2004-363641 | 12/2004 |
| JP | A-2005-204042 | 7/2005  |
| JP | A-2007-300254 | 11/2007 |
| JP | B2-4017984   | 12/2007 |

OTHER PUBLICATIONS

International Search Report for International Patent Application No. PCT/JP2009/005540, mailed on Dec. 15, 2009 (w/ English translation).

*Primary Examiner* — Joseph Chang
(74) *Attorney, Agent, or Firm* — Oliff PLC

(57) ABSTRACT

It is possible to reduce the size of a surface acoustic wave resonator by enhancing the Q value. In a surface acoustic wave resonator in which an IDT having electrode fingers for exciting surface acoustic waves is formed on a crystal substrate, a line occupying ratio is defined as a value obtained by dividing the width of one electrode finger by the distance between the center lines of the gaps between one electrode finger and the electrode fingers adjacent to both sides thereof, and the IDT includes a region formed by gradually changing the line occupying ratio from the center to both edges so that the frequency gradually becomes lower from the center to both edges than the frequency at the center of the IDT.

12 Claims, 11 Drawing Sheets

SURFACE ACOUSTIC WAVE RESONATOR, SURFACE ACOUSTIC WAVE OSCILLATOR, AND SURFACE ACOUSTIC WAVE MODULE UNIT

This is a Continuation of application Ser. No. 13/124,980 filed Apr. 19, 2011, which claims the benefit of International Application No. PCT/JP2009/005540 filed Oct. 22, 2009 and Japanese Application No. 2008-273972 filed Oct. 24, 2008. The disclosure of the prior applications is hereby incorporated by reference herein in its entirety.

TECHNICAL FIELD

The present invention relates to a surface acoustic wave resonator employing a piezoelectric substrate, a surface acoustic wave oscillator, and a surface acoustic wave module unit.

BACKGROUND ART

Conventionally, surface acoustic wave resonators using surface acoustic waves (SAW) have been widely used in electronic apparatuses.

With the recent spread of portable devices, a decrease in the size of a surface acoustic wave resonator used therein has been required. With the decrease in the size of the surface acoustic wave resonator, there is a problem in that a decrease in Q value or an increase in CI value is caused and thus the characteristics of the surface acoustic wave resonator cannot be satisfactorily obtained.

As a countermeasure, for example, PTL 1 discloses a technique of enhancing the Q value by reducing a ratio (a line width ratio or a line occupying ratio) of an electrode finger width to an electrode finger pitch in a comb-like electrode from the center of the comb-like electrode to both edges thereof using a 41°-rotated Y-cut lithium niobate substrate.

CITATION LIST

Patent Literature

[PTL 1] JP-A-63-135010

SUMMARY OF THE INVENTION

Problems that the Invention is to Solve

However, in the configuration of the surface acoustic wave resonator described in PTL 1, the reflection of surface acoustic waves at the edges of an IDT increases but the frequency at the edges of the IDT increases more than that at the center of the IDT. Accordingly, the confinement of energy of the surface acoustic waves in the IDT deteriorates and the increase in Q value is not satisfactory.

PTL 1 describes a lithium niobate substrate as a piezoelectric substrate, but does not describe a crystal substrate.

Means for Solving the Problems

The invention is made to solve at least a part of the abovementioned problems and can be embodied by the following aspects or applications.

(Application 1) There is a provided a surface acoustic wave resonator in which an IDT including electrode fingers for exciting surface acoustic waves is disposed on a piezoelectric substrate, wherein a line occupying ratio is defined as a value obtained by dividing the width of one electrode finger of the electrode fingers by the distance between a center line of a gap between the one electrode finger and the electrode finger adjacent to one side thereof and a center line of a gap between the one electrode finger and the electrode finger adjacent to the other side thereof, and the IDT includes a region formed by sequentially changing the line occupying ratio from the center to both edges thereof so that the frequency gradually becomes lower from the center to both edges than the frequency at the center of the IDT.

According to this configuration, the frequency is set to gradually decrease by gradually changing the line occupying ratio from the center of the IDT having a large vibration displacement to the edge of the IDT having a small vibration displacement.

In this way, by weighting the IDT with the line occupying ratio, it is possible to enhance the confinement of vibration energy in the IDT, thereby implementing a surface acoustic wave resonator having a Q value more excellent than that of the conventional surface acoustic wave resonator. In this way, it is possible to reduce the size of the surface acoustic wave resonator.

(Application 2) In the surface acoustic wave resonator, the region in which the frequency gradually becomes lower from the center of the IDT to both edges thereof may have the line occupying ratio larger than that at the center of the IDT.

According to this configuration, by setting the line occupying ratio to be larger than that at the center of the IDT, it is possible to lower the frequency.

(Application 3) In the surface acoustic wave resonator, a region in which the line occupying ratio is constant may be disposed at the center of the IDT, and a ratio Nf/N of the number of pairs of electrode fingers Nf in the region in which the line occupying ratio is constant to the total number of pairs of electrode fingers N in the IDT may be in the range of 0<Nf/N<0.59.

According to this configuration, by disposing a region in which the line occupying ratio is constant at the center of the IDT, the vibration displacement at the center increases. The frequency at the edges of the IDT is set to be lower than that at the center of the IDT having a large vibration displacement by changing the line occupying ratio. Accordingly, it is possible to enhance the confinement of vibration energy in the IDT. When the ratio Nf/N of the number of pairs of electrode fingers Nf in the region in which the line occupying ratio is constant to the total number of pairs of electrode fingers N in the IDT is set to the above-mentioned range, it is possible to implement a surface acoustic wave resonator having a Q value more excellent than that of the conventional surface acoustic wave resonator.

(Application 4) In he surface acoustic wave resonator, a ratio $\eta e/\eta c$ of the line occupying ratio $\eta e$ at the edge of the IDT to the line occupying ratio $\eta c$ at the center of the IDT may be in the range of $1<\eta e/\eta c<1.79$.

When the ratio $\eta e/\eta c$ of the line occupying ratio at the edge to the line occupying ratio at the center of the IDT is in the range of $1.0<\eta e/\eta c<1.79$, the Q value is enhanced more than that when the weighting is not performed with the line occupying ratio ($<\eta e/\eta c=1.0$).

(Application 5) In the surface acoustic wave resonator, a ratio $\eta r/\eta e$ of the line occupying ratio $\eta r$ in a reflector to the line occupying ratio $\eta e$ at the edge of the IDT may be in the range of $0.65<\eta r/\eta e<1.58$.

When the ratio $\eta r/\eta e$ of the reflector to the edge of the IDT is in the range of $0.65<\eta r/\eta e<1.58$, it is possible to obtain the Q value higher than that of the conventional surface acoustic wave resonator.

(Application 6) In the surface acoustic wave resonator, the piezoelectric substrate may be a crystal substrate with an Euler angle (−1° to +1°, 26.0° to 40.7°, 85° to 95°).

According to this configuration, by using the crystal substrate having the Euler angle (−1° to +1°, 26.0° to 40.7°, 85° to 95°), it is possible to provide a surface acoustic wave resonator having an excellent frequency-temperature characteristic and an enhanced Q value.

(Application 7) According to another aspect of the invention, there is provided a surface acoustic wave oscillator in which the above-mentioned surface acoustic wave resonator and a circuit element are mounted on a package.

According to this configuration, since the surface acoustic wave resonator having the enhanced Q value and the reduced CI value is mounted, it is possible to provide a surface acoustic wave oscillator in which the excitation of surface acoustic waves is stabilized and the power consumption is reduced.

(Application 8) According to still another aspect of the invention, there is provided a surface acoustic wave module unit in which the above-mentioned surface acoustic wave resonator is mounted on a circuit board.

According to this configuration, since the surface acoustic wave resonator having the enhanced Q value and the reduced CI value is mounted, it is possible to provide a surface acoustic wave module unit in which the excitation of surface acoustic waves is stabilized and the power consumption is reduced.

MODE FOR CARRYING OUT THE INVENTION

Figure 1:
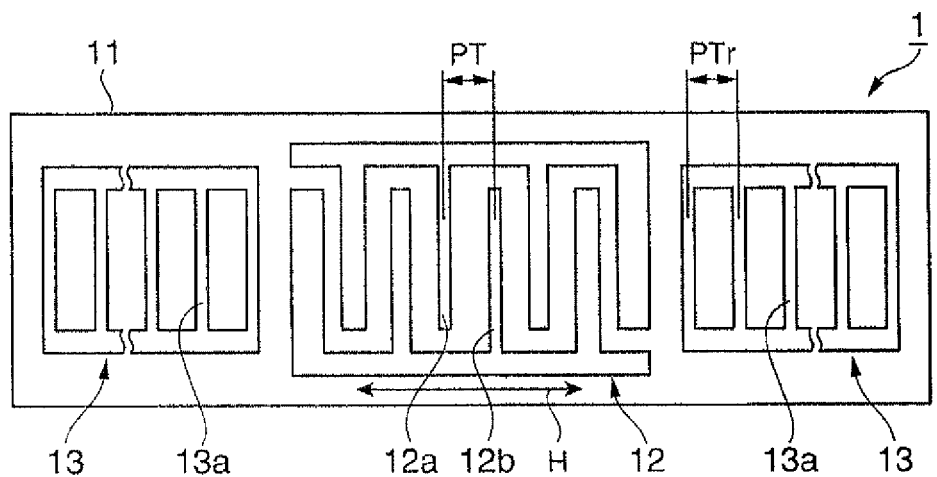
FIG. 1 is a plan view schematically illustrating the configuration of a surface acoustic wave resonator according to a first embodiment of the invention.

Hereinafter, exemplary embodiments of the invention will be described with reference to the accompanying drawings. In the drawings described below, size scales of constituent elements are appropriately changed to easily recognize the constituent elements.

(Surface Acoustic Wave Resonator as Comparative Example)

First, a surface acoustic wave resonator as a comparative example will be described for the purpose of easy understanding of the invention and comparison with the embodiments.

Figure 22:
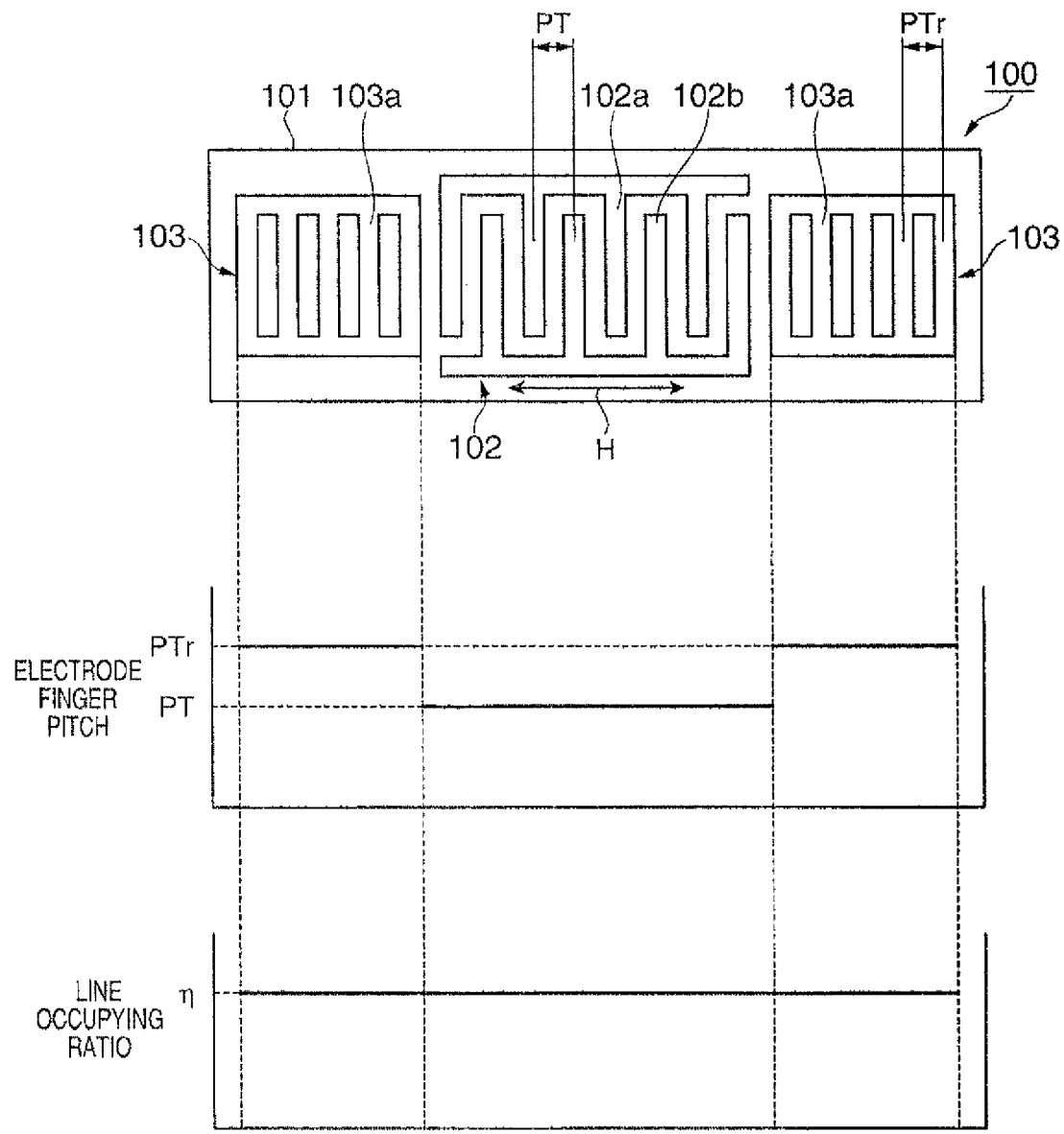
FIG. 22 is a diagram schematically illustrating a conventional surface acoustic wave resonator.

FIG. 22 is a diagram schematically illustrating a conventional surface acoustic wave resonator.

The surface acoustic wave resonator 100 includes an IDT 102 having a comb-like electrode and a pair of reflectors 103 disposed with the IDT 102 interposed therebetween in the direction (the direction of arrow H) in which surface acoustic waves travel, on a crystal substrate 101.

When a cut face and a surface acoustic wave traveling direction are expressed by the Euler angle ($\phi$, $\theta$, $\psi$), the crystal substrate 101 is a substrate within the range of Euler angle (−1° to +1°, 26.0° to 40.7°, 85° to 95°).

In the IDT 102, electrode fingers 102a and 102b having different electrical polarities are alternately arranged. Two electrode fingers 102a and 102b are called a pair of electrode fingers.

The electrode finger pitch PT which is a distance between the centers of neighboring electrode fingers 102a and 102b is uniform in the IDT 102.

In the reflectors 103, plural electrode fingers 103a are arranged to be electrically neutral. The electrode finger pitch PTr which is a distance between the centers of neighboring electrode fingers 103a is also uniform in the reflectors 103.

Figure 23:
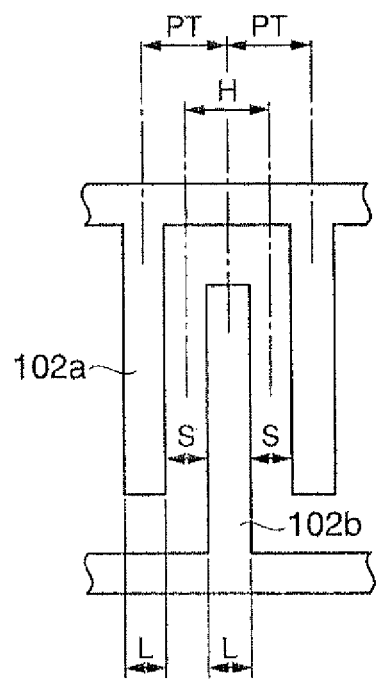
FIG. 23 is a diagram schematically illustrating the line occupying ratio.

Here, a ratio at which the electrode fingers occupy the IDT 102 and the reflectors 103 in the direction in which the surface acoustic waves travel is referred to as a line occupying ratio η. The line occupying ratio η will be described in detail with reference to FIG. 23.

It is assumed that the line width of the electrode fingers 102a and 102b is L, the distance between neighboring electrode fingers (a space in which the electrode fingers are not formed) is S, and the distance between the center lines between the neighboring electrode fingers is defined as the electrode finger pitch PT. The distance between the center lines of gaps between the neighboring electrode fingers is defined as H. Then, the line occupying ratio η is expressed by η=L/H=L/(L+1/2(S+S))=L/(L+S). In this way, since the electrode fingers having the same line width are arranged with the same electrode finger pitch, the electrode finger pitch is expressed by PT=L+S=H.

The line occupying ratio η of the surface acoustic wave resonator 100 has the same value in the IDT 102 and the reflectors 103 and is set to η=0.43.

The IDT 102 and the reflectors 103 are formed of a metal material such as aluminum (Al) and are set to a predetermined thickness (=0.06λ, where λ is a wavelength of the surface acoustic waves). The number of pairs of electrode fingers in the IDT 102 is set to 100 and the number of pairs of electrode fingers in each of the reflectors 103 is set to 25 (150 pairs in total).

In such a surface acoustic wave resonator 100, SH (Shear Horizontal) waves are excited by the IDT 102 and the Q value as a characteristic thereof is 5500.

First Embodiment

A surface acoustic wave resonator according to a first embodiment of the invention will be described below.

Figure 2:
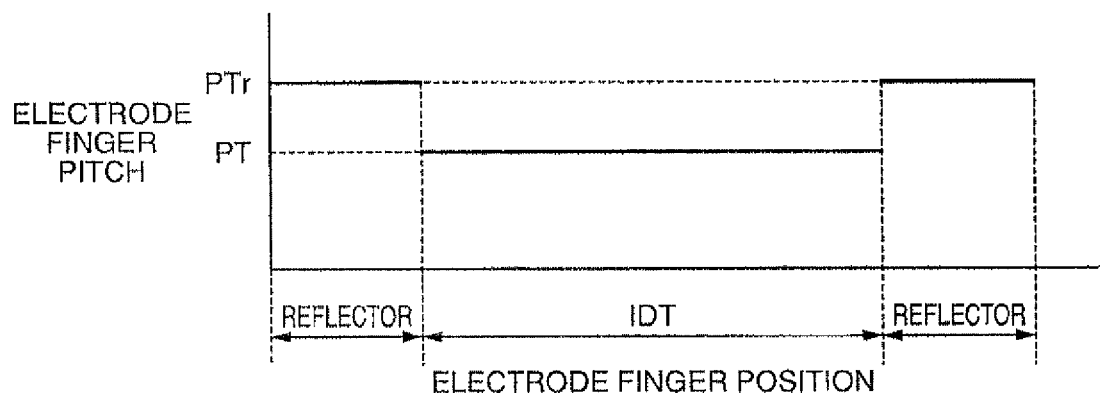
FIG. 2 is a diagram illustrating the relation between an electrode finger position and an electrode finger pitch in the surface acoustic wave resonator according to the first embodiment.
Figure 3:
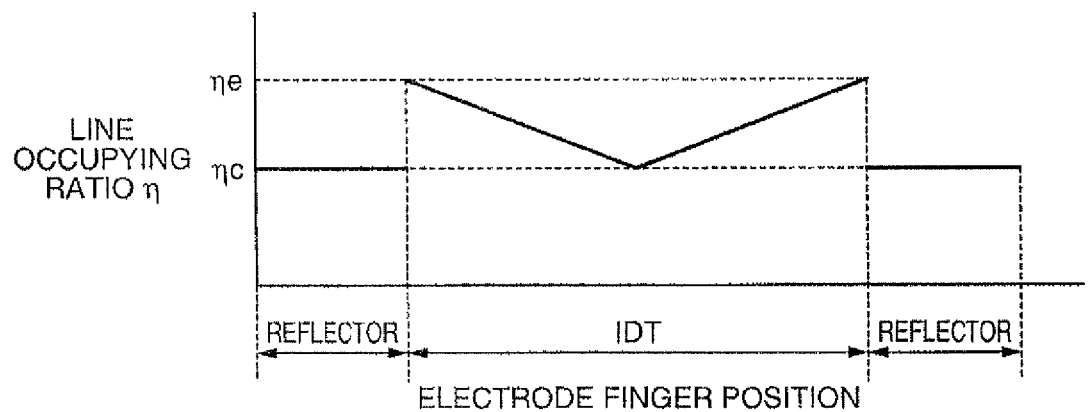
FIG. 3 is a diagram illustrating the relation between the electrode finger position and the line occupying ratio in the surface acoustic wave resonator according to the first embodiment.
Figure 4:
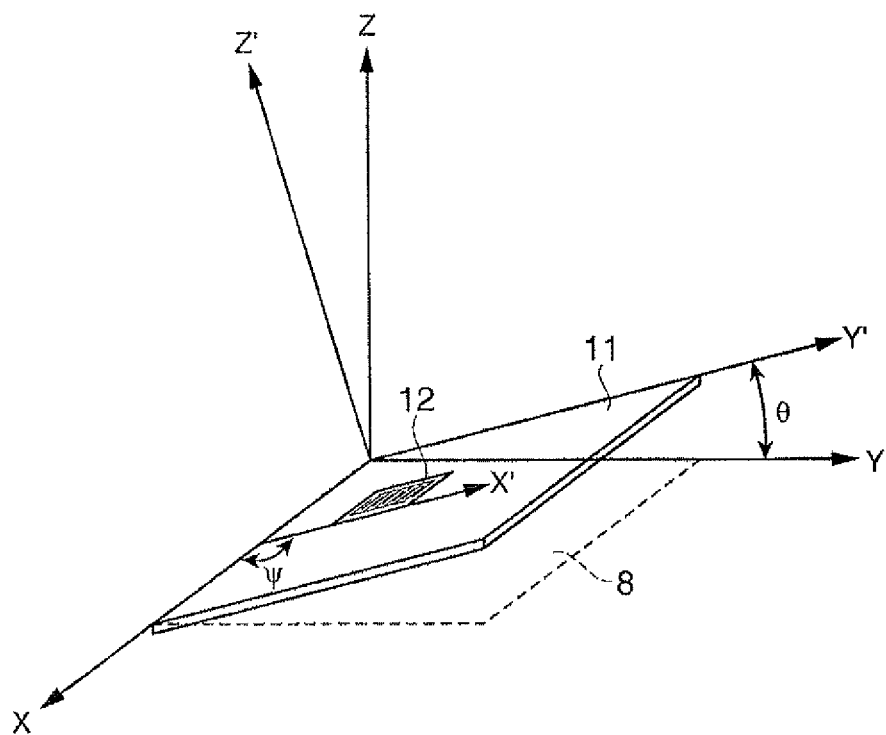
FIG. 4 is a diagram illustrating a cutout angle of a crystal substrate and a traveling direction of surface acoustic waves.
Figure 5:
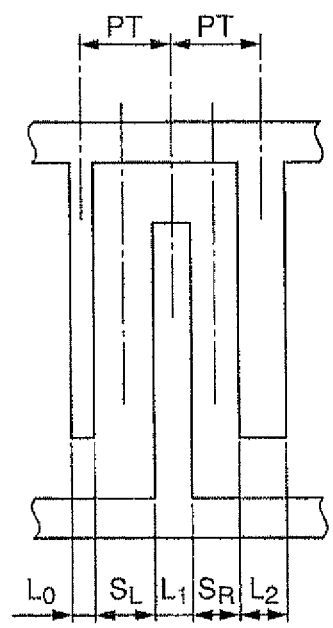
FIG. 5 is a diagram schematically illustrating the line occupying ratio.

FIG. 1 is a plan view schematically illustrating the configuration of a surface acoustic wave resonator according to this embodiment. FIG. 2 is a diagram illustrating the relation between an electrode finger position and an electrode finger pitch in the surface acoustic wave resonator according to this embodiment. FIG. 3 is a diagram illustrating the relation between the electrode finger position and a line occupying ratio in the surface acoustic wave resonator according to this embodiment. FIG. 4 is a diagram illustrating a cutout angle of a crystal substrate and a traveling direction of surface acoustic waves. FIG. 5 is a diagram schematically illustrating the line occupying ratio.

As shown in FIG. 1, the surface acoustic wave resonator 1 includes an IDT 12 having a comb-like electrode and a pair of reflectors 13 disposed with the IDT 12 interposed therebetween in the direction (the direction of arrow H) in which surface acoustic waves travel, on a crystal substrate 11 as a piezoelectric substrate.

When a cut face and a surface acoustic wave traveling direction are expressed by the Euler angle (φ, θ, ψ), the crystal substrate 11 is a crystal substrate with an Euler angle of (−1° to +1°, 26.0° to 40.7°, 85° to 95°).

As shown in FIG. 4, crystal axes of the crystal are defined by an X axis (electrical axis), a Y axis (mechanical axis), and a Z axis (optical axis), and the Euler angle (0°, 0°, 0°) is a crystal z plate 8 perpendicular to the Z axis. Here, the Euler angle φ (not shown) is involved in a first rotation of the crystal Z plate 8, and represents a first rotation angle in which the Z axis is set as a rotation axis and a rotating direction from +X axis to the +Y axis is defined as a positive rotating direction. The Euler angle θ is involved in a second rotation performed after the first rotation of the crystal Z plate 8, and represents a second rotation angle in which the X axis after the first rotation is set as a rotation axis and a rotating direction from +Y axis after the first rotation to the +Z axis is defined as a positive rotating direction. The cut face of the crystal substrate 11 is determined by the first rotation angle φ and the second rotation angle θ. The Euler angle ψ is involved in a third rotation performed after the second rotation of the crystal Z plate 8, and represents a third rotation angle in which the Z axis after the second rotation is set as a rotation axis and a rotating direction from +X axis after the second rotation to the +Y axis after the second rotation is defined as a positive rotating direction. The surface acoustic wave traveling direction is represented by the third rotation angle ψ about the X axis after the second rotation. The surface acoustic wave resonator 1 employs the crystal substrate 11 in which the first rotation angle φ is in the range of −1° to +1° and the second rotation angle θ is in the range of 26.0° to 40.7°. The IDT 12 is disposed so that the surface acoustic wave traveling direction ψ is in the range of 85° to 95°. The angle ψ is also referred to as an in-plane rotation angle. In this crystal substrate, the variation in frequency with the variation in temperature is small and thus the frequency-temperature characteristic is excellent.

In the IDT 12, electrode fingers 12a and 12b are alternately arranged so as to have different electrical polarities. In this embodiment, two neighboring electrode fingers 12a and 12b are counted as a pair of electrodes and the number of pairs of electrode fingers in the IDT 12 is set to 100.

Here, the distance between the centers of the neighboring electrode fingers 12a and 12b is defined as an electrode finger pitch. The electrode finger pitch of the IDT 12 is PT which is constant as shown in FIG. 2.

The ratio of the electrode fingers occupying the IDT 12 and the reflectors 13 in the surface acoustic wave traveling direction is defined as a line occupying ratio η.

The different line occupying ratios of the neighboring electrode fingers 12a and 12b are based on the difference in the size between the adjacent spaces on both sides thereof and the line occupying ratio is calculated as follows.

As shown in FIG. 5, it is assumed that the line widths of the neighboring electrode fingers are $L_0$, $L_1$, and $L_2$, the distances between the neighboring electrode fingers (of the spaces in which no electrode finger is formed) are $S_L$ and $S_R$, and the electrode finger pitch is PT. Then, the electrode finger pitch is calculated as $PT=S_L+1/2(L_0+L_1)$ or $PT=S_R+1/2(L_1+L_2)$ and the line occupying ratio of the center electrode finger is calculated as $\eta=L_1/(L_1+1/2(S_L+S_R))$.

As shown in FIG. 3, when the line occupying ratio η at the center of the IDT 12 is ηc and the line occupying ratio η at the edge of the IDT 12 is ηe, the line occupying ratio η of the IDT 12 has a relation of ηc<ηe. The line occupying ratio varies to gradually increase from the center to both edges of the IDT 12 from the line occupying ratio ηc to the line occupying ratio ηe.

As shown in FIG. 1, in the reflectors 13, plural electrode fingers 13a are arranged to be electrically neutral. Here, the reflectors 13 may be grounded or may be connected to one of the electrode fingers 12a and 12b.

The electrode finger pitch which is the distance between the centers of the neighboring electrode fingers 13a is set to PTr which is constant as shown in FIG. 2. The line occupying ratio of the reflectors 13 is set to the same value as the line occupying ratio ηc at the center of the IDT 12, as shown in FIG. 3.

In the reflectors 13, two neighboring electrode fingers 13a are counted as a pair of electrodes and 25 pairs of (50) electrode fingers 13a are arranged on each side in this embodiment.

The IDT 12 and the reflectors 13 are formed of aluminum (Al) as a metal material and the thickness thereof is set to 0.0λ (where λ is the wavelength of a surface acoustic wave).

The electrode finger pitches are set to PT=5.000 μm and PTr=5.025 μm and the line occupying ratios are set to ηc=0.43 and ηe=0.53.

In the surface acoustic wave resonator 1 having the above-mentioned configuration, SH waves are excited in the IDT 12 and the Q value as a characteristic thereof is 10,800.

The characteristics of the surface acoustic wave resonator according to this embodiment will be described in detail below.

Figure 6:
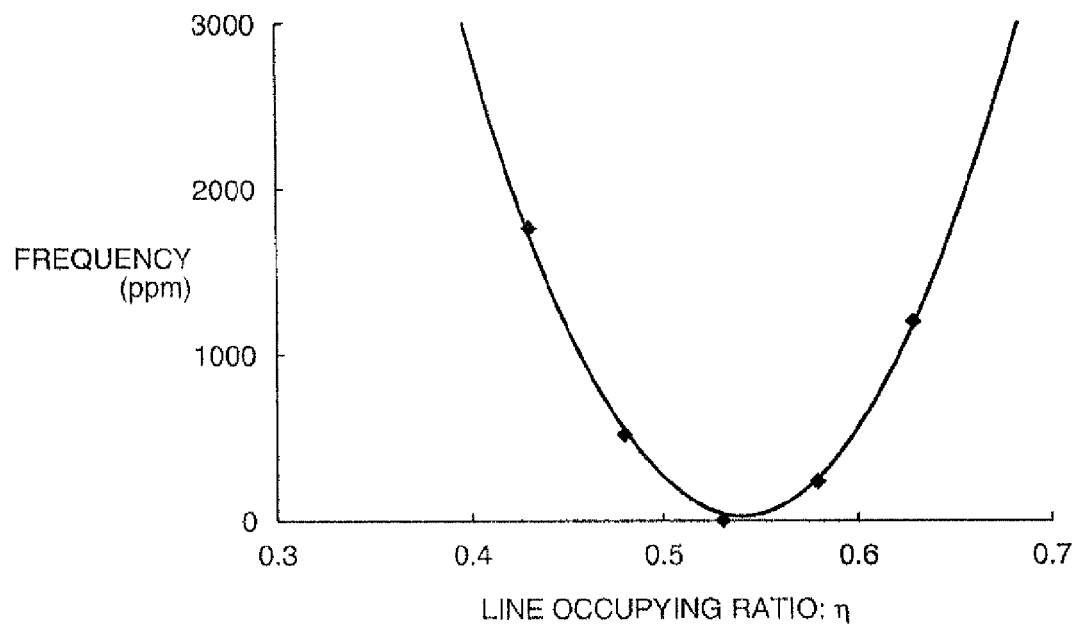
FIG. 6 is a graph illustrating the relation between the line occupying ratio 11 and the frequency of the surface acoustic wave resonator according to the first embodiment.

FIG. 6 is a graph illustrating the relation between the line occupying ratio η and the frequency in the surface acoustic wave resonator.

The frequency is lowered when the line occupying ratio η increases from about 0.4 and the frequency is the minimum when the line occupying ratio η is about 0.53. When the line occupying ratio η further increases from 0.53, the frequency is raised.

In this embodiment, the line occupying ratio at the center of the IDT 12 is set to ηc=0.43, the line occupying ratio at the edges of the IDT 12 is set to ηe=0.53, and the frequency at the edges of the IDT 12 is set to be lower than the frequency at the center of the IDT 12. By gradually changing the line occupying ratio from the center to the edges of the IDT 12, the frequency is gradually lowered.

Figure 7:
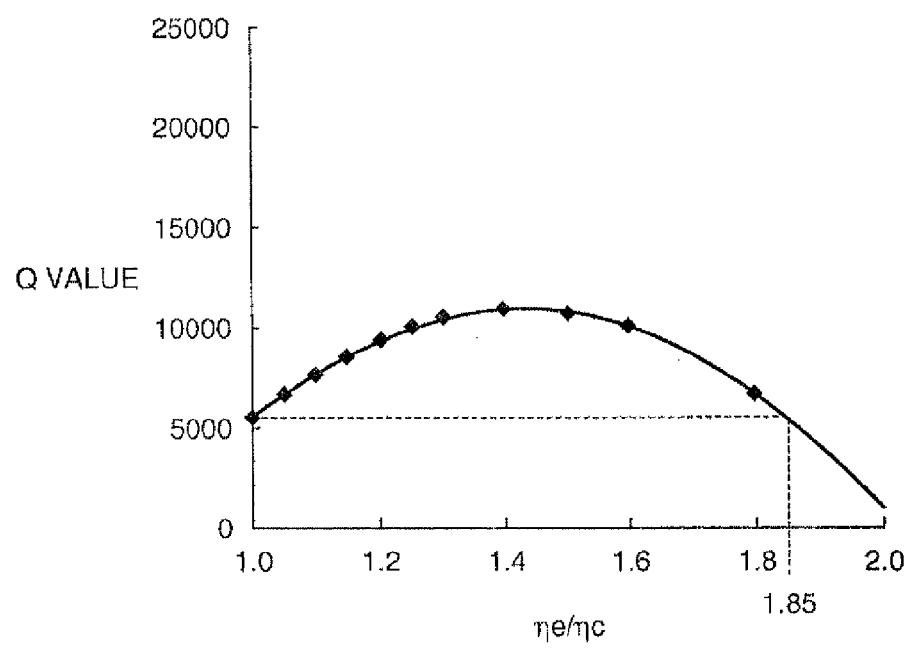
FIG. 7 is a graph illustrating the relation between the Q value and a value ($\eta e/\eta c$) obtained by dividing the line occupying ratio $\eta e$ at the edge of an IDT by the line occupying ratio $\eta c$ at the center of the IDT according to the first embodiment.

FIG. 7 is a graph illustrating the relation between the Q value and the value (ηe/ηc) obtained by dividing the line occupying ratio ηe at the edges of the IDT by the line occupying ratio ηc at the center of the IDT.

As can be seen from this graph, the Q value increases as ηe/ηc increases from 1.0, and the Q value is the maximum at ηe/ηc=1.4. As ηe/ηc increases from 1.4, the Q value decreases.

When the ratio ηe/ηc of the line occupying ratios at the center and the edges of the IDT 12 is in the range of 1.0<ηe/ηc<1.85, the Q value exceeds the Q value (5,500) of the conventional surface acoustic wave resonator and the Q value increases more than that in the case where the weighting is not performed using the line occupying ratio (ηe/ηc=1.0).

As described above, in the surface acoustic wave resonator 1, the line occupying ratio 11 is made to gradually vary from the center of the IDT 12 having a large vibration displacement to the edges of the IDT 12 having a small vibration displacement, whereby the frequency is gradually lowered.

In this way, since the reflection of surface acoustic waves due to the frequency difference in addition to the reflection of surface acoustic waves at the end surfaces of the electrode fingers occurs in many places, it is possible to enhance the confinement of vibration energy in the IDT 12 and to implement a surface acoustic wave resonator 1 having a Q value excellent than that of the conventional surface acoustic wave resonator. Accordingly, it is possible to reduce the size of the surface acoustic wave resonator 1. The reflection of surface acoustic waves due to the frequency difference is described in detail in JP-A-10-335966 and thus is not described herein.

Tables 1 and 2 show the Q values of the surface acoustic wave resonator when the Euler angle of the crystal substrate is variously changed. Table 1 is based on the comparative example where the line occupying ratio ηc and the line occupying ratio ηe are set to the same value so that the line occupying ratio is constant all over the IDT, and Table 2 is based on the first embodiment of the invention.

The IDT 12 and the reflectors 13 are formed of aluminum (Al) which is a metal material, and the thickness thereof is set to 0.06λ (where λ is the wavelength of surface acoustic waves) when the Euler angle of the crystal substrate is (−1° to +1°, 26.0° to 40.7°, 85° to 95°) and is set to 0.1λ when the Euler angle of the crystal substrate is (−1° to +1°, 113° to 135°, ±5).

TABLE 1

| Euler angle | | | IDT | | | | | reflector | | |
|---|---|---|---|---|---|---|---|---|---|---|
| φ [°] | θ [°] | ψ [°] | Number of pairs | Pt [μm] | ηc | ηe | ηe/ηc | Number of pairs | PTr [μm] | Q |
| 0 | 38.5 | 90 | 100 | 5.000 | 0.36 | 0.36 | 1.00 | 25 | 5.025 | 5521 |
| −1 | 26 | 85 | | | | | | | | 4860 |
| | | 95 | | | | | | | | 5366 |
| | 40.7 | 85 | | | | | | | | 6609 |
| | | 95 | | | | | | | | 6314 |
| 1 | 26 | 85 | | | | | | | | 5366 |
| | | 95 | | | | | | | | 4860 |
| | 40.7 | 85 | | | | | | | | 6314 |
| | | 95 | | | | | | | | 6609 |
| 0 | 33.35 | 90 | | | | | | | | 4151 |
| −1 | 113 | −5 | 30 | | 0.55 | 0.55 | | 5 | | 5426 |
| | | 5 | | | | | | | | 5407 |
| | 135 | −5 | | | | | | | | 4773 |
| | | 5 | | | | | | | | 4776 |
| 1 | 113 | −5 | | | | | | | | 5407 |
| | | 5 | | | | | | | | 5426 |
| | 135 | −5 | | | | | | | | 4776 |
| | | 5 | | | | | | | | 4773 |
| 0 | 124 | 0 | | | | | | | | 5206 |

TABLE 2

| Euler angle | | | IDT | | | | | reflector | | |
|---|---|---|---|---|---|---|---|---|---|---|
| φ [°] | θ [°] | ψ [°] | Number of pairs | Pt [μm] | ηc | ηe | ηe/ηc | Number of pairs | PTr [μm] | Q |
| 0 | 38.5 | 90 | 100 | 5.000 | 0.36 | 0.50 | 1.39 | 25 | 5.025 | 5667 |
| −1 | 26 | 85 | | | | | | | | 5328 |
| | | 95 | | | | | | | | 6183 |
| | 40.7 | 85 | | | | | | | | 7065 |
| | | 95 | | | | | | | | 6736 |
| 1 | 26 | 85 | | | | | | | | 6183 |
| | | 95 | | | | | | | | 5328 |
| | 40.7 | 85 | | | | | | | | 6736 |
| | | 95 | | | | | | | | 7065 |
| 0 | 33.35 | 90 | | | | | | | | 4609 |
| −1 | 113 | −5 | 30 | | 0.55 | 0.75 | 1.36 | 5 | | 25677 |
| | | 5 | | | | | | | | 25660 |
| | 135 | −5 | | | | | | | | 22020 |
| | | 5 | | | | | | | | 22050 |
| 1 | 113 | −5 | | | | | | | | 25660 |
| | | 5 | | | | | | | | 25677 |
| | 135 | −5 | | | | | | | | 22050 |
| | | 5 | | | | | | | | 22020 |
| 0 | 124 | 0 | | | | | | | | 23173 |

Comparing Tables 1 and 2, it can be clearly seen that the surface acoustic wave resonator according to this embodiment can realize a Q value higher than that of the surface acoustic wave resonator in which the line occupying ratio is kept constant all over the IDT.

Particularly, when the Euler angle of the crystal substrate is (−1° to +1°, 113° to 135°, ±5), the IDT 12 includes 30 pairs of electrode fingers and the reflectors 13 includes the pairs of electrode fingers smaller by 5, but a high Q value equal to or greater than 20,000 can be obtained, which is very effective.

When it is intended to reduce the size by reducing the number of pairs of electrode fingers in the IDT 12 or the reflectors 13, the energy confinement of the surface acoustic waves is weakened, thereby causing a decrease in Q value. Accordingly, by increasing the thickness of the IDT 12 or the reflectors 13, it is tried to increase the amount of surface acoustic waves reflected per electrode finger and to enhance the energy confinement of the surface acoustic waves. However, when the thickness is increased, some energy of the surface acoustic waves can be easily converted into bulk waves at the time of reflecting the surface acoustic waves from the electrode fingers, whereby the enhancement in energy confinement or the increase in Q value may not be satisfactory. In this embodiment, the increase in bulk wave conversion loss due to the increase in thickness is suppressed, thereby accomplishing the enhancement in energy confinement or the increase in Q value.

When the Euler angle of the crystal substrate is (−1° to +1°, 113° to 135°, ±5), Rayleigh waves are excited. When the Euler angle of the crystal substrate is (−1° to +1°, 26.0° to 40.7°, 85° to 95°), SH waves are excited. The advantages of this embodiment can be exhibited in any of the Rayleigh waves and the SH waves.

(Modification 1)

A modification of the surface acoustic wave resonator according to the first embodiment of the invention will be described below.

In the first embodiment, the line occupying ratio of the reflectors is set to the same as the line occupying ratio at the center of the IDT. However, in this modification, the line occupying ratio of the reflectors is set to the same as the line occupying ratio at the edges of the IDT.

Figure 8:
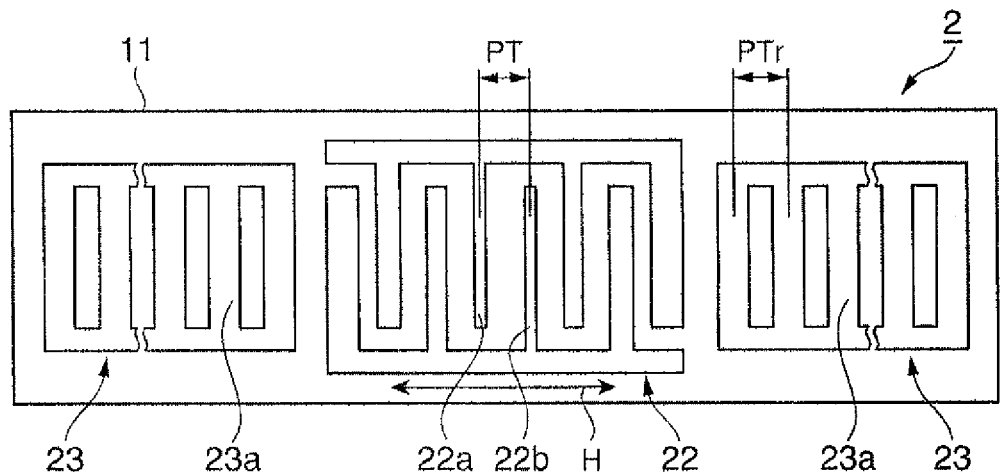
FIG. 8 is a plan view schematically illustrating the configuration of a surface acoustic wave resonator according to Modification 1 of the invention.
Figure 9:
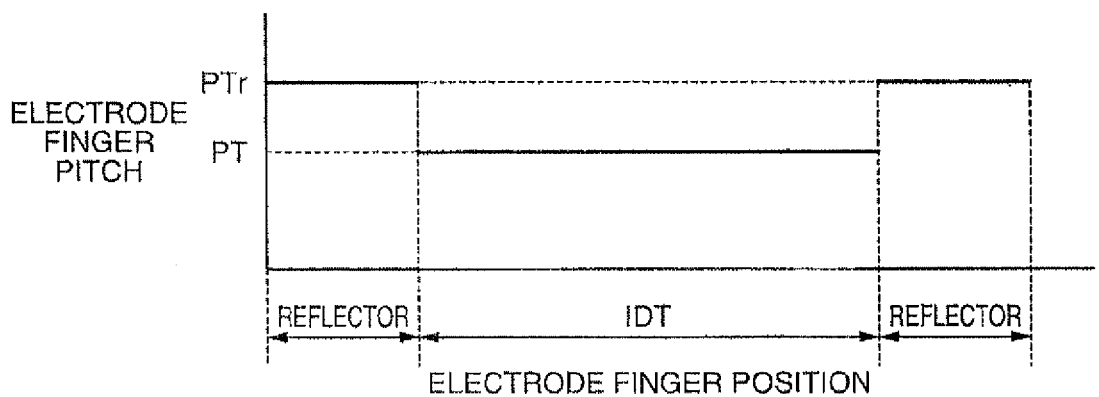
FIG. 9 is a diagram illustrating the relation between an electrode finger position and an electrode finger pitch in the surface acoustic wave resonator according to Modification 1.
Figure 10:
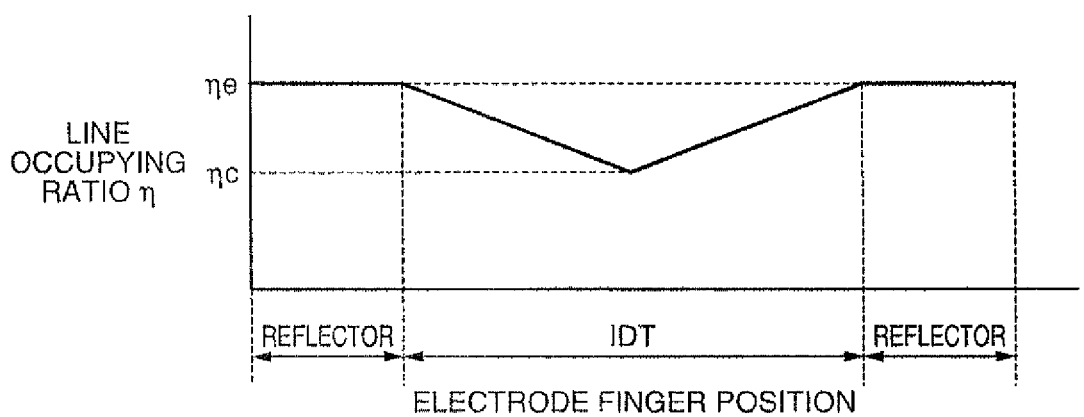
FIG. 10 is a diagram illustrating the relation between the electrode finger position and the line occupying ratio in the surface acoustic wave resonator according to Modification 1.

FIG. 8 is a plan view schematically illustrating the configuration of a surface acoustic wave resonator according to this modification. FIG. 9 is a diagram illustrating the relation between the electrode finger position and the electrode finger pitch in the surface acoustic wave resonator according to this modification. FIG. 10 is a diagram illustrating the relation between the electrode finger position and the line occupying ratio in the surface acoustic wave resonator according to this modification.

As shown in FIG. 8, a surface acoustic wave resonator 2 includes an IDT 22 having a comb-like electrode and a pair of reflectors 23 disposed with the IDT 22 interposed therebetween in the direction (the direction of arrow H) in which surface acoustic waves travel, on a crystal substrate 11.

When the cut face and the surface acoustic wave traveling direction are expressed by the Euler angle (φ, θ, ψ), the crystal substrate 11 is a crystal substrate with the Euler angle of (−1° to +1°, 26.0° to 40.7°, 85° to 95°). In other embodiments, a crystal substrate with the Euler angle of (−1° to +1°, 113° to 135°, ±5) may be used.

In the IDT 22, electrode fingers 22a and 22b are alternately arranged so as to have different electrical polarities. In this modification, the number of pairs of electrode fingers in the IDT 22 is set to 100.

The electrode finger pitch of the IDT 22 is constant as PT, as shown in FIG. 9.

As shown in FIG. 10, when the line occupying ratio η at the center of the IDT 22 is ηc and the line occupying ratio η at the edge of the IDT 22 is ηe, the line occupying ratio η of the IDT 22 has a relation of ηc<ηe. The line occupying ratio varies to gradually increase from the center to both edges of the IDT 22 from the line occupying ratio ηc to the line occupying ratio ηe.

In the reflectors 23, plural electrode fingers 23a are arranged to be electrically neutral. Here, the reflectors 23 may be grounded or may be connected to one of the electrode fingers 22a and 22b.

The electrode finger pitch which is the distance between the centers of the neighboring electrode fingers 23a is set to PTr which is constant. The line occupying ratio of the reflectors 23 is set to the same value as the line occupying ratio ηe at the edges of the IDT 22.

In the reflectors 23, 25 pairs of electrode fingers 23a are arranged on each side in this modification.

The IDT 22 and the reflectors 23 are formed of aluminum (Al) as a metal material and the thickness thereof is set to $0.06\lambda$ (where $\lambda$ is the wavelength of a surface acoustic wave).

The electrode finger pitches are set to PT=5.000 μm and PTr=5.025 μm and the line occupying ratios are set to $\eta c$=0.43 and $\eta e$=0.56.

In the surface acoustic wave resonator 2 having the above-mentioned configuration, SH waves are excited in the IDT 22 and the Q value as a characteristic thereof is 20,000.

Figure 11:
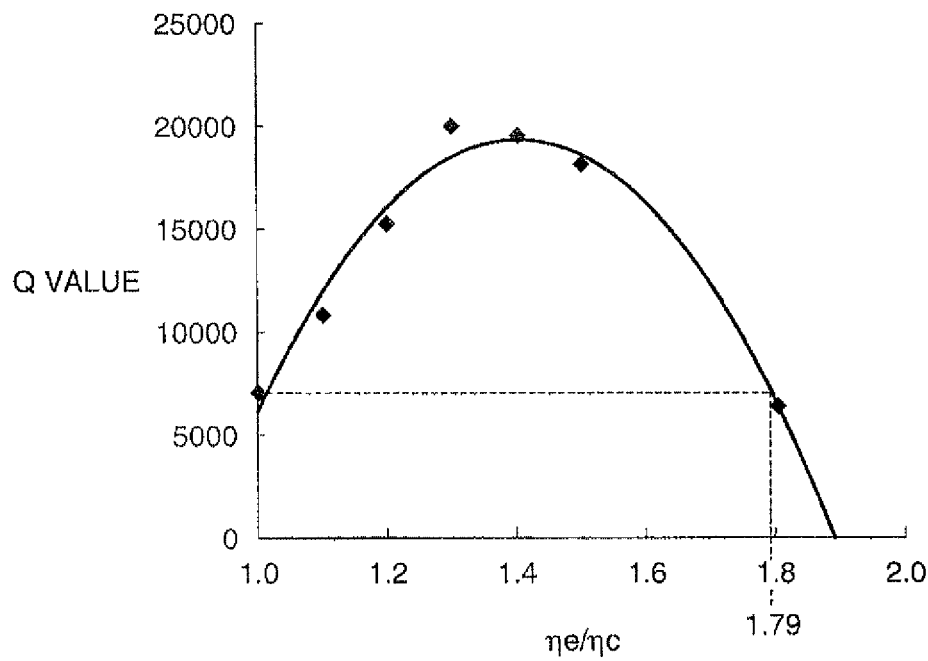
FIG. 11 is a graph illustrating the relation between the Q value and a value ($\eta e/\eta c$) obtained by dividing the line occupying ratio $\eta e$ at the edge of an IDT by the line occupying ratio $\eta c$ at the center of the IDT according to Modification 1.

FIG. 11 is a graph illustrating the relation between the Q value and the value ($\eta e/\eta c$) obtained by dividing the line occupying ratio $\eta e$ at the edges of the IDT by the line occupying ratio $\eta c$ at the center of the IDT.

As can be seen from this graph, the Q value increases as $\eta e/\eta c$ increases from 1.0, and the Q value is the maximum at $\eta e/\eta c$=1.3. As $\eta e/\eta c$ increases from 1.3, the Q value decreases.

The ratio $\eta e/\eta c$ of the line occupying ratios at the center and the edges of the IDT is in the range of $1.0 < \eta e/\eta c < 1.79$, a Q value equal to or greater than 6,180 can be obtained and the Q value increases more than that in the case where the weighting is not performed using the line occupying ratio ($\eta e/\eta c$=1.0).

(Modification 2)

Another modification of the surface acoustic wave resonator according to the first embodiment of the invention will be described below.

In the first embodiment, the line occupying ratio of the reflectors is set to the same as the line occupying ratio at the center of the IDT. However, in this modification, the line occupying ratio of the reflectors is set to greater than the line occupying ratio at the edges of the IDT.

The configuration of the surface acoustic wave resonator according to this modification is almost the same as Modification 1 and thus will not be described in detail but in brief.

Figure 12:
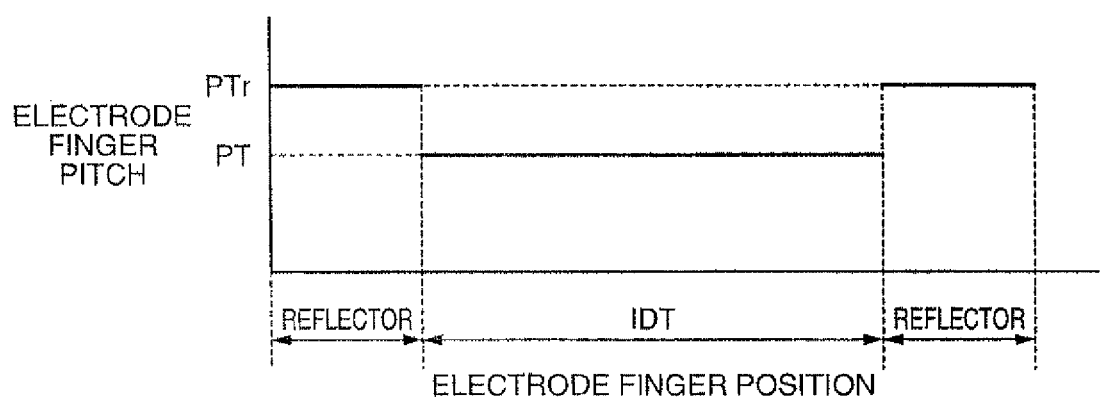
FIG. 12 is a diagram illustrating the relation between an electrode finger position and an electrode finger pitch in a surface acoustic wave resonator according to Modification 2.
Figure 13:
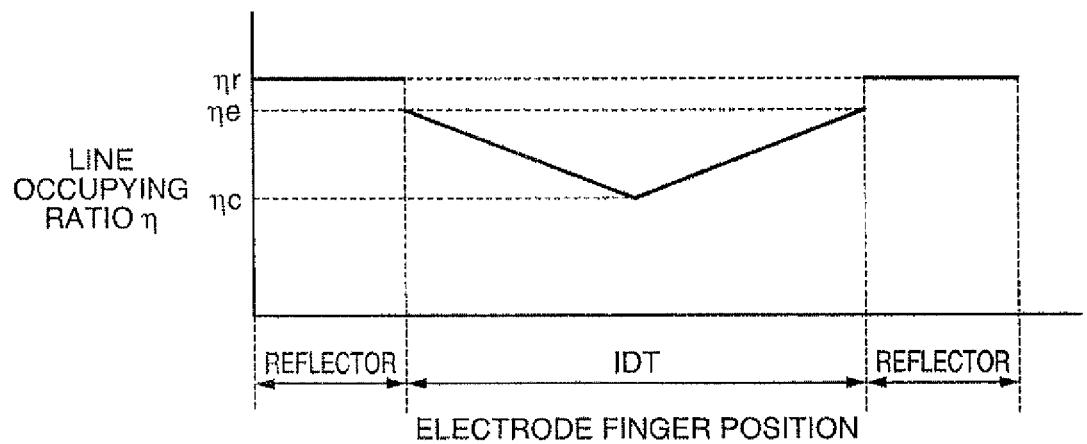
FIG. 13 is a diagram illustrating the relation between the electrode finger position and the line occupying ratio in the surface acoustic wave resonator according to Modification 2.

FIG. 12 is a diagram illustrating the relation between an electrode finger position and an electrode finger pitch in a surface acoustic wave resonator according to this modification. FIG. 13 is a diagram illustrating the relation between the electrode finger position and the line occupying ratio in the surface acoustic wave resonator according to this modification.

The surface acoustic wave resonator includes an IDT having a comb-like electrode and a pair of reflectors.

When the cut face and the surface acoustic wave traveling direction are expressed by the Euler angle ($\phi$, $\theta$, $\psi$), the crystal substrate is a crystal substrate with the Euler angle of (−1° to +1°, 26.0° to 40.7°, 85° to 95°). In other embodiments, a crystal substrate with the Euler angle of (−1° to +1°, 113° to 135°, ±5) may be used.

The number of pairs of electrode fingers in the IDT is set to 100 and the electrode finger pitch of the IDT is constant as PT, as shown in FIG. 12.

As shown in FIG. 13, when the line occupying ratio $\eta$ at the center of the IDT is $\eta c$ and the line occupying ratio $\eta$ at the edge of the IDT is $\eta e$, the line occupying ratio $\eta$ of the IDT has a relation of $\eta c < \eta e$. The line occupying ratio varies to gradually increase from the center to both edges of the IDT from the line occupying ratio $\eta c$ to the line occupying ratio $\eta e$.

The electrode finger pitch in the reflectors is constant as PTr. The line occupying ratio $\eta r$ of the reflectors is set to be greater than the line occupying ratio $\eta e$ at the edges of the IDT.

In the reflectors, 25 pairs of electrode fingers are arranged on each side in this modification.

The IDT and the reflectors are formed of aluminum (Al) as a metal material and the thickness thereof is set to $0.06\lambda$ (where $\lambda$ is the wavelength of a surface acoustic wave).

The electrode finger pitches are set to PT=5.000 μm and PTr-5.025 μm and the line occupying ratios are set to $\eta c$=0.43, $\eta e$=0.53, and $\eta r$=0.58.

In the surface acoustic wave resonator having the above-mentioned configuration, SH waves are excited in the IDT and the Q value as a characteristic thereof is 20,500.

Figure 14:
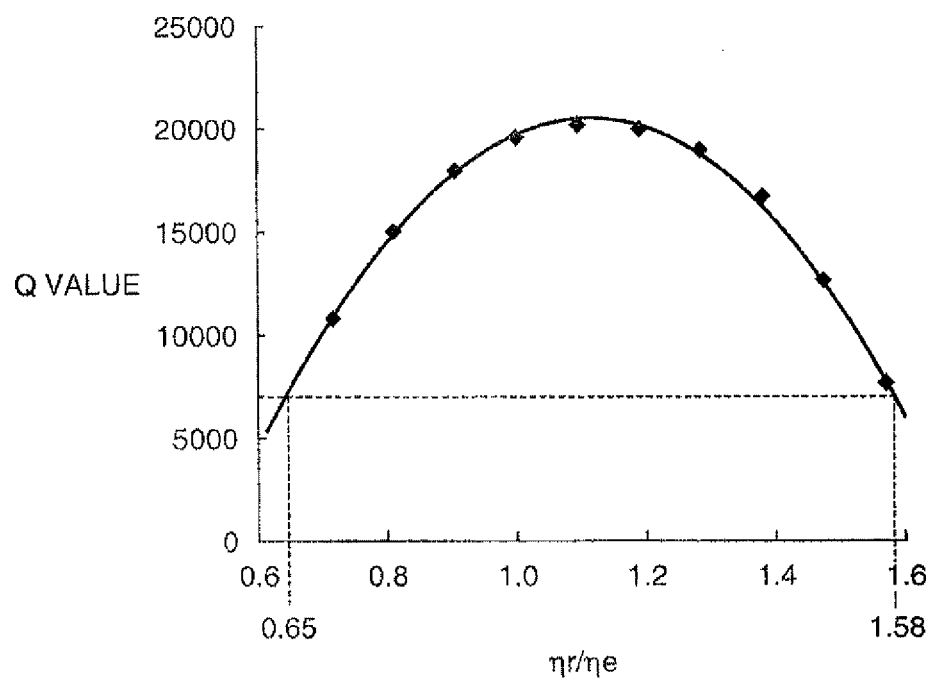
FIG. 14 is a graph illustrating the relation between the Q value and a value ($\eta r/\eta e$) obtained by dividing the line occupying ratio $\eta e$ in a reflector by the line occupying ratio $\eta e$ at the edge of the IDT according to Modification 2.

FIG. 14 is a graph illustrating the relation between the Q value and the value ($\eta r/\eta e$) obtained by dividing the line occupying ratio $\eta r$ of the reflectors by the line occupying ratio $\eta e$ at the edges of the IDT.

As can be seen from this graph, the Q value increases when $\eta r/\eta e$ increases from 0.6 and the Q value is the maximum when $\eta r/\eta e$=1.1. As $\eta r/\eta e$ increases from 1.1, the Q value decreases.

The ratio $\eta r/\eta e$ of the line occupying ratios in the reflectors and at the edges of the IDT is in the range of $0.65 \leq \eta r/\eta e \leq 1.58$, a Q value equal to or greater than 7,450 can be obtained.

Second Embodiment

A surface acoustic wave resonator according to a second embodiment of the invention will be described below.

In this embodiment, a region having a constant line occupying ratio is disposed at the center of the IDT.

Figure 15:
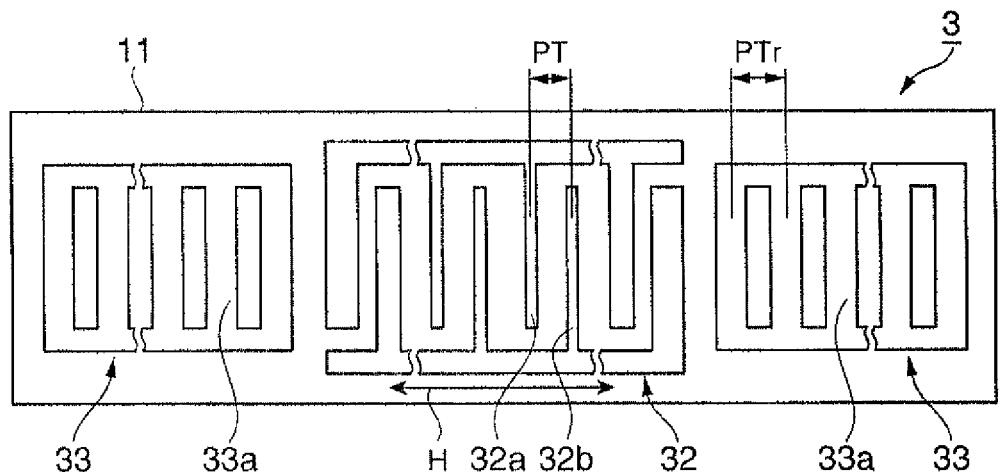
FIG. 15 is a plan view schematically illustrating the configuration of a surface acoustic wave resonator according to a second embodiment of the invention.
Figure 16:
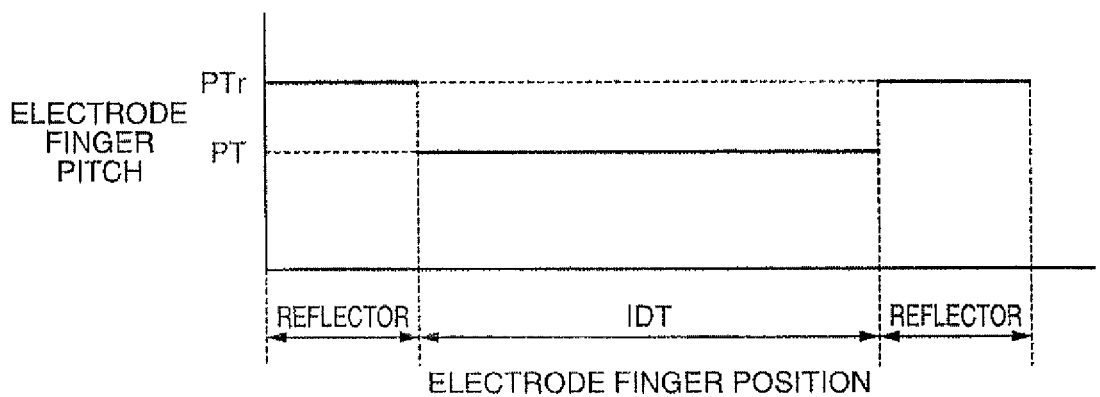
FIG. 16 is a diagram illustrating the relation between an electrode finger position and an electrode finger pitch in the surface acoustic wave resonator according to the second embodiment.
Figure 17:
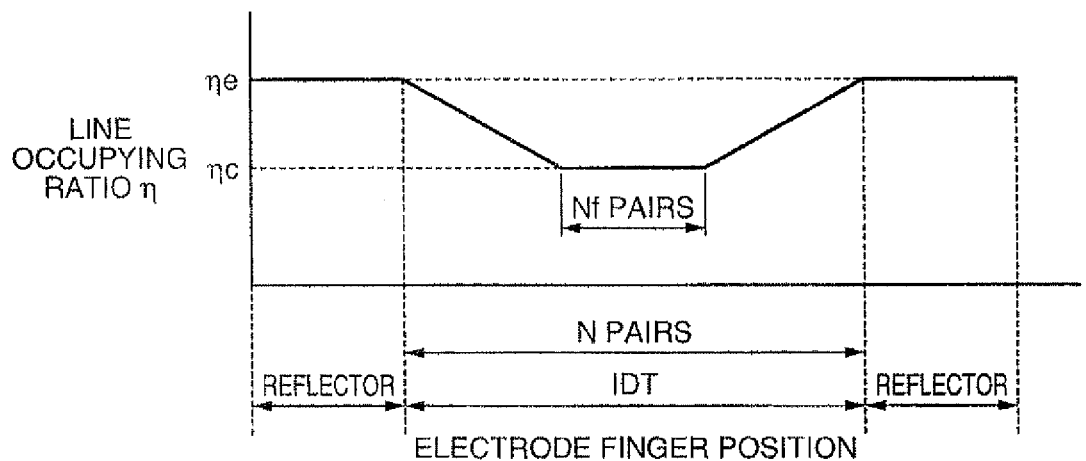
FIG. 17 is a diagram illustrating the relation between the electrode finger position and the line occupying ratio in the surface acoustic wave resonator according to the second embodiment.

FIG. 15 is a plan view schematically illustrating the configuration of a surface acoustic wave resonator according to this. FIG. 16 is a diagram illustrating the relation between the electrode finger position and the electrode finger pitch in the surface acoustic wave resonator according to this embodiment. FIG. 17 is a diagram illustrating the relation between the electrode finger position and the line occupying ratio in the surface acoustic wave resonator according to this embodiment.

As shown in FIG. 15, a surface acoustic wave resonator 3 includes an IDT 32 having a comb-like electrode and a pair of reflectors 33 disposed with the IDT 32 interposed therebetween in the direction (the direction of arrow H) in which surface acoustic waves travel, on a crystal substrate 31.

When the cut face and the surface acoustic wave traveling direction are expressed by the Euler angle ($\phi$, $\theta$, $\psi$), the crystal substrate 11 is a crystal substrate with the Euler angle of (−1° to +1°, 26.0° to 40.7°, 85° to 95°). In other embodiments, a crystal substrate with the Euler angle of (−1° to +1°, 113° to 135°, ±5) may be used.

In the IDT 32, electrode fingers 32a and 32b are alternately arranged so as to have different electrical polarities.

The electrode finger pitch of the IDT 32 is constant as PT, as shown in FIG. 16.

As shown in FIG. 17, the IDT 32 includes a region having a constant line occupying ratio at the center of the IDT 32. When the line occupying ratio $\eta$ of the region having the constant line occupying ratio is $\eta c$ and the line occupying ratio $\eta$ at the edges of the IDT 32 is $\eta e$, a relation of $\eta c < \eta e$ is satisfied. The line occupying ratio varies to gradually increase from the center to both edges of the IDT 32 from the line occupying ratio $\eta c$ to the line occupying ratio $\eta e$.

When the number of pairs of electrode fingers in the IDT 32 is N and the number of pairs of electrode fingers at the center is Nf, the number of pairs of electrode fingers N in the IDT 32 is set to 100 and the number of pairs of electrode fingers Nf at the center is set to 40.

As shown in FIG. 16, in the reflectors 33, plural electrode fingers 33a are arranged to be electrically neutral. Here, the reflectors 33 may be grounded or may be connected to one of the electrode fingers 32a and 32b.

The electrode finger pitch which is the distance between the centers of the neighboring electrode fingers 33a is set to PTr which is constant. The line occupying ratio of the reflectors 33 is set to the same value as the line occupying ratio ηe at the edges of the IDT 32.

In the reflectors 33, 25 pairs of electrode fingers 33a are arranged on each side in this embodiment.

The IDT 32 and the reflectors 33 are formed of aluminum (Al) as a metal material and the thickness thereof is set to 0.06λ (where λ is the wavelength of a surface acoustic wave). The electrode finger pitches are set to PT=5.000 μm and PTr=5.025 μm and the line occupying ratios are set to ηc=0.43 and ηe=0.645.

In the surface acoustic wave resonator 3 having the above-mentioned configuration, SH waves are excited in the IDT 32 and the Q value as a characteristic thereof is 22,500.

Figure 18:
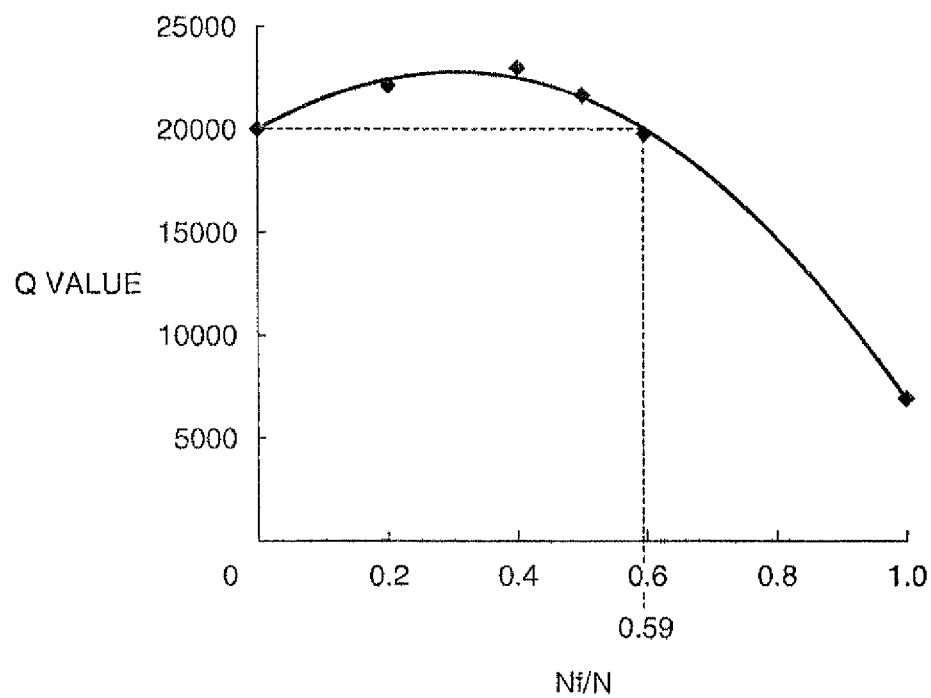
FIG. 18 is a graph illustrating the relation between the Q value and a value (Nf/N) obtained by dividing the number of pairs of electrode fingers Nf at the center of an IDT by the total number of pairs of electrode fingers N in the IDT according to the second embodiment.

FIG. 18 is a graph illustrating the relation between the Q value and the value (Nf/N) obtained by dividing the number of pairs Nf at the center of the IDT by the number of pairs N in the IDT.

As can be seen from this graph, the Q value increases as Nf/N increases from 0, and the Q value is the maximum at Nf/N=0.4. That is, when the number of pairs of electrode fingers in the region having the constant line occupying ratio is 40% of the number of pairs in the IDT, the Q value is the maximum. As Nf/N increases from 0.4, the Q value decreases.

When Nf/N is in the range of 0<Nf/N<0.59, the Q value equal to or greater than 20,000 can be obtained. Accordingly, the Q value is enhanced more than that in the case where the region having the constant line occupying ratio is not disposed at the center of the IDT (ηe/ηc=1.0).

Figure 19:
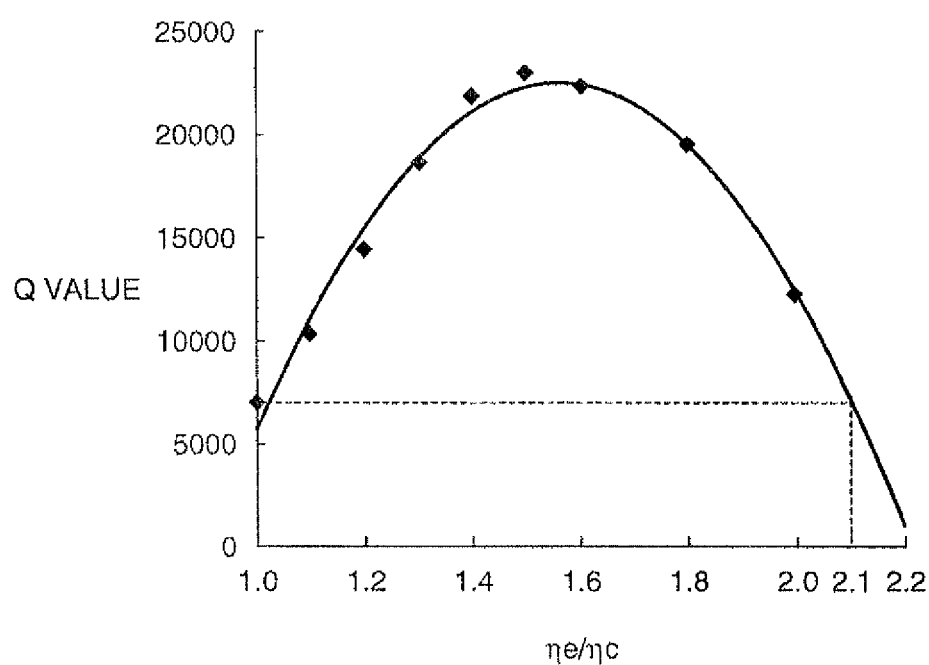
FIG. 19 is a graph illustrating the relation between the Q value and a value ($\eta e/\eta c$) obtained by dividing the line occupying ratio $\eta e$ at the edge of an IDT by the line occupying ratio $\eta c$ at the center of the IDT according to the second embodiment.

FIG. 19 is a graph illustrating the relation between the Q value and the value (ηe/ηc) obtained by dividing the line occupying ratio ηe at the edges of the IDT by the line occupying ratio ηc at the center of the IDT.

As can be seen from this graph, the Q value increases as ηe/ηc increases from 1.0, and the Q value is the maximum at ηe/ηc=1.5. As ηe/ηc increases from 1.5, the Q value decreases.

The ratio ηe/ηc of the line occupying ratios at the center and the edges of the IDT is in the range of 1.0<ηe/ηc<2.1, the Q value equal to or greater than 5,800 can be obtained and the Q value increases more than that in the case where the region having the constant line occupying ratio is not disposed at the center of the IDT (ηe/ηc=1.0).

As described above, by disposing the region having the constant line occupying ratio at the center of the IDT 32, the vibration displacement at the center increases. The frequency at the edges of the IDT 32 is set to be lower than that at the center of the IDT 32 having a large vibration displacement by changing the line occupying ratio. Accordingly, it is possible to enhance the confinement of vibration energy in the IDT 32. When the ratio Nf/N of the number of pairs of electrode fingers Nf in the region having the constant line occupying ratio to the total number of pairs of electrode fingers N in the IDT 32 is set to the above-mentioned range, it is possible to implement a surface acoustic wave resonator 3 having a Q value more excellent than that of the conventional surface acoustic wave resonator. As a result, it is possible to reduce the size of the surface acoustic wave resonator 3.

In the above-mentioned embodiments, aluminum (Al) is used as the electrode material of the IDT and the reflectors, but the same advantages can be obtained from an aluminum alloy. Examples of the electrode material other than aluminum include gold (Au), silver (Ag), copper (Cu), tungsten (W), tantalum (Ta), and alloys containing any thereof as a main component.

Although it has been described in the above-mentioned embodiments that the electrode thickness of the IDT is set to 0.06λ (where λ is the wavelength of the surface acoustic waves), it has been confirmed that the same advantages can be obtained with an electrode thickness other than 0.06λ.

Although it has been described in the above-mentioned embodiment that the reflectors are disposed on both sides of the IDT, the same advantages can be obtained without employing the reflectors.

Third Embodiment

A surface acoustic wave oscillator in which the above-mentioned surface acoustic wave resonator is mounted on a package may be constructed.

Figure 20:
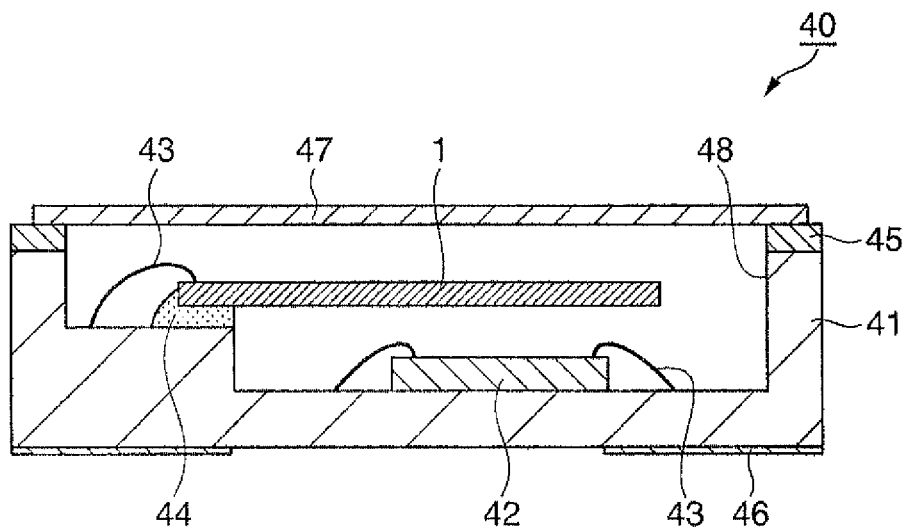
FIG. 20 is a sectional view schematically illustrating a surface acoustic wave oscillator according to a third embodiment of the invention.

FIG. 20 is a sectional view schematically illustrating a surface acoustic wave oscillator in which a surface acoustic wave resonator is mounted on a package.

The surface acoustic wave oscillator 40 includes a ceramic package 41, an IC chip 42, a surface acoustic wave resonator 1, and a lid member 47.

The ceramic package 41 includes a concave section 48 formed by stacking and then opening ceramic sheets. A seam ring 45 formed of a metal material such as cobalt to surround the opening is disposed in the ceramic package 41. An external connection electrode 46 for connection to an external device such as a circuit board is formed on the outer circumference of the ceramic package 41. Although not shown, an interconnection connecting the external connection electrode 46 to the concave section 48 of the ceramic package 41 is provided.

The IC chip 42 as a circuit element is fixed to the bottom surface of the concave section 48 of the ceramic package 41 and is mounted thereon via a metal wire such as a gold wire. The IC chip 42 includes an oscillation circuit exciting the surface acoustic wave resonator 1 and may further include a temperature compensating circuit and a voltage control circuit. The surface acoustic wave resonator 1 is fixed to a platform portion of the concave section 48 of the ceramic package 41 with an adhesive 44. A pad is connected to the IDT with a metal wire 43.

The lid member 47 formed of a metal material such as cobalt is disposed above the concave section 48 of the ceramic package 41. The inside of the concave section 48 of the ceramic package 41 is air-tightly sealed by seam-welding the seam ring 45 to the lid member 47.

In this way, since the surface acoustic wave resonator 1 with an increased Q value and a decreased CI value is mounted on the ceramic package 41, it is possible to provide a surface acoustic wave oscillator 40 in which the excitation of surface acoustic waves is stabilized and the power consumption is lowered.

Fourth Embodiment

A surface acoustic wave module unit mounted with the surface acoustic wave resonator can be constructed.

Figure 21:
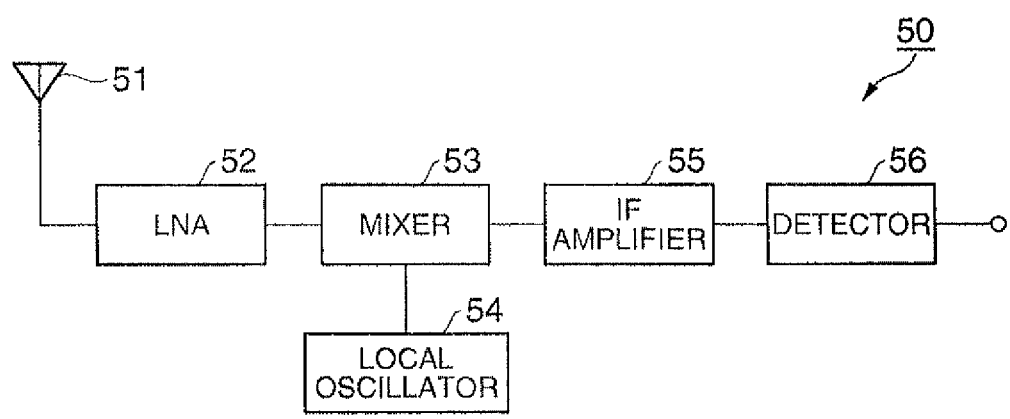
FIG. 21 is a circuit block diagram illustrating a receiver module mounted with a surface acoustic wave resonator according to a fourth embodiment of the invention.

FIG. 21 is a circuit block diagram illustrating an example of a surface acoustic wave module unit in which the surface acoustic wave resonator is mounted on a circuit board to form a receiver module.

The receiver module 50 includes a receiver antenna 51, a low noise amplifier (LNA) 52, a mixer 53, a local oscillator 54, an intermediate frequency (IF) amplifier 55, and a detector 56.

The receiver antenna 51 is connected to an input of the mixer 53 via the LNA 52. The local oscillator 54 is also connected to the input of the mixer 53. The local oscillator includes a surface acoustic wave resonator and an oscillation circuit exciting the surface acoustic wave resonator. Accordingly, the local oscillator 54 can satisfactorily output a frequency signal to the mixer 53. The IF amplifier 55 and the detector 56 are connected in series to the output of the mixer 53.

A signal transmitted from a transmitter as the opposite party is input to the LNA 52 via the receiver antenna 51, is amplified by the LNA 52, and is then input to the mixer 53. The mixer 53 receives the frequency signal from the local oscillator 54 and down-converts and outputs the signal input from the LNA 52. The down-converted signal is amplified by the IF amplifier 55 and then is input to and detected by the detector 56. By employing this configuration, the receiver module 50 can receive the signal transmitted from the transmitter. Since the receiver module 50 includes the surface acoustic wave resonator disposed in the local oscillator 54, it is possible to provide a receiver module which can stably receive a signal and has low power consumption.

The receiver module may be mounted on an outer package and the like to form an electronic apparatus.

DESCRIPTION OF REFERENCE NUMERALS AND SIGNS

1, 2, 3: SURFACE ACOUSTIC WAVE RESONATOR
8: CRYSTAL Z-PLATE
11: CRYSTAL SUBSTRATE
12: IDT
12a, 12b: ELECTRODE FINGER OF IDT
13: REFLECTOR
13a: ELECTRODE FINGER OF REFLECTOR
22: IDT
22a, 22b: ELECTRODE FINGER OF IDT
23: REFLECTOR
23a: ELECTRODE FINGER OF REFLECTOR
32: IDT
32a, 32b: ELECTRODE FINGER OF IDT
33: REFLECTOR
33a: ELECTRODE FINGER OF REFLECTOR
40: SURFACE ACOUSTIC WAVE OSCILLATOR
41: CERAMIC PACKAGE
32a, 32b: ELECTRODE FINGER OF IDT
33: REFLECTOR
33a: ELECTRODE FINGER OF REFLECTOR
40: SURFACE ACOUSTIC WAVE OSCILLATOR
41: CERAMIC PACKAGE
42: IC CHIP
43: METAL WIRE
44: ADHESIVE
45: SEAM RING
46: EXTERNAL CONNECTION ELECTRODE
47: LID BODY
50: RECEIVER MODULE
51: RECEIVER ANTENNA
52: LOW NOISE AMPLIFIER (LNA)
53: MIXER
54: LOCAL OSCILLATOR
55: INTERMEDIATE FREQUENCY (IF) AMPLIFIER
56: DETECTOR

The invention claimed is:

1. A surface acoustic wave resonator comprising:
a piezoelectric substrate; and
an interdigitated transducer including electrode fingers for exciting surface acoustic waves disposed on the piezoelectric substrate,
wherein a line occupying ratio is defined as a value obtained by dividing a width of one of the electrode fingers by a distance between a center line of a gap between the one electrode finger and an adjacent one of the electrode fingers to one side thereof and a center line of a gap between the one electrode finger and the adjacent one of the electrode fingers to the other side thereof,
wherein the interdigitated transducer includes a region formed by sequentially changing the line occupying ratio from a center to both edges thereof so that the frequency gradually becomes lower from the center to both edges than the frequency at the center of the interdigitated transducer, and
wherein the piezoelectric substrate is a crystal substrate with an Euler angle (−1° to +1°, 113° to 135°, ±5°).

2. The surface acoustic wave resonator according to claim 1, wherein the region in which the frequency gradually becomes lower from the center of the interdigitated transducer to both edges thereof has the line occupying ratio larger than that at the center of the interdigitated transducer.

3. The surface acoustic wave resonator according to claim 1, wherein a region in which the line occupying ratio is constant is disposed at the center of the interdigitated transducer, and
wherein a ratio Nf/N of the number of pairs of electrode fingers Nf in the region in which the line occupying ratio is constant to a total number of pairs of electrode fingers N in the interdigitated transducer is in the range of $0<Nf/N<0.59$.

4. The surface acoustic wave resonator according to claim 1, wherein a ratio $\eta e/\eta c$ of the line occupying ratio $\eta e$ at the edge of the interdigitated transducer to the line occupying ratio $\eta c$ at the center of the interdigitated transducer is in the range of $1<\eta e/\eta c<1.79$.

5. The surface acoustic wave resonator according to claim 1, wherein a ratio $\eta r/\eta e$ of the line occupying ratio $\eta r$ in a reflector to the line occupying ratio $\eta e$ at the edge of the interdigitated transducer is in the range of $0.65 \leq \eta r/\eta e \leq 1.58$.

6. A surface acoustic wave oscillator comprising the surface acoustic wave resonator according to claim 1 and a circuit element that are mounted on a package.

7. A surface acoustic wave module unit comprising the surface acoustic wave resonator according to claim 1 that is mounted on a circuit board.

8. The surface acoustic wave resonator according to claim 2, wherein a region in which the line occupying ratio is constant is disposed at the center of the interdigitated transducer, and
wherein a ratio Nf/N of the number of pairs of electrode fingers Nf in the region in which the line occupying ratio is constant to the total number of pairs of electrode fingers N in the interdigitated transducer is in the range of $0<Nf/N<0.59$.

9. The surface acoustic wave resonator according to claim 2, wherein a ratio $\eta e/\eta c$ of the line occupying ratio $\eta e$ at the edge of the interdigitated transducer to the line occupying ratio $\eta c$ at the center of the is in the range of $1<\eta e/\eta c<1.79$.

10. The surface acoustic wave resonator according to claim 2, further comprising at least one reflector, wherein a ratio $\eta r/\eta e$ of the line occupying ratio $\eta r$ in the at least one reflector to the line occupying ratio ηe at the edge of the interdigitated transducer is in the range of $0.65 \leq \eta r/\eta e \leq 1.58$.

11. A surface acoustic wave oscillator comprising the surface acoustic wave resonator according to claim 2 and a circuit element that are mounted on a package.

12. A surface acoustic wave module unit comprising the surface acoustic wave resonator according to claim 2 that is mounted on a circuit board.

\* \* \* \* \*